(12) United States Patent
Jung et al.

(10) Patent No.: US 7,274,584 B2
(45) Date of Patent: Sep. 25, 2007

(54) SEMICONDUCTOR MEMORY DEVICE HAVING WORDLINE ENABLE SIGNAL LINE AND METHOD OF ARRANGING THE SAME

(75) Inventors: Dae-Hee Jung, Gyeonggi-do (KR); Chul-Woo Park, Gyeonggi-do (KR); Yun-Sang Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/330,819

(22) Filed: Jan. 11, 2006

(65) Prior Publication Data

US 2006/0152992 A1 Jul. 13, 2006

(30) Foreign Application Priority Data

Jan. 12, 2005 (KR) ............... 10-2005-0002875

(51) Int. Cl.
*G11C 5/06* (2006.01)
(52) U.S. Cl. .......................................... 365/63; 365/51
(58) Field of Classification Search ................. 365/63, 365/51, 230.03
See application file for complete search history.

(56) References Cited

U.S. PATENT DOCUMENTS

| | | | |
|---|---|---|---|
| 5,727,180 A * | 3/1998 | Davis et al. ............ | 711/100 |
| 5,768,174 A | 6/1998 | Seo et al. | |
| 6,377,483 B1 * | 4/2002 | Arimoto et al. .......... | 365/149 |
| 6,381,167 B2 * | 4/2002 | Ooishi et al. ............ | 365/63 |
| 2005/0247981 A1 * | 11/2005 | Wang ..................... | 257/369 |

FOREIGN PATENT DOCUMENTS

| | | |
|---|---|---|
| JP | 06-195964 | 7/1994 |
| JP | 09-045077 | 2/1997 |
| KR | 2000-0045415 | 7/2000 |

OTHER PUBLICATIONS

English language abstract of Korean Publication No. 2000-0045415.
English language abstract of Japanese Publication No. 06-195964.
English language abstract of Japanese Publication No. 09-045077.

* cited by examiner

*Primary Examiner*—Vu A. Le
(74) *Attorney, Agent, or Firm*—Marger Johnson & McCollom, P.C.

(57) ABSTRACT

Provided are a semiconductor memory device having a wordline enable signal line arrangement scheme, which can reduce VPP power consumption and can increase the speed of driving a sub-wordline, and a method of arranging wordline enable signal lines in the semiconductor memory device. In the semiconductor memory device, a wordline enable driver is arranged in a row decoder region outside a memory array region, and the wordline enable signal lines are formed of an uppermost metal layer among three metal layers constituting the semiconductor memory device. Each of the wordline enable signal lines is connected to a sub-wordline driver, rather than to a pair of sub-wordline drivers. In other words, the wordline enable signal lines vertically and horizontally extend forming an inverse L shape.

15 Claims, 3 Drawing Sheets

SEMICONDUCTOR MEMORY DEVICE HAVING WORDLINE ENABLE SIGNAL LINE AND METHOD OF ARRANGING THE SAME

CROSS-REFERENCE TO RELATED PATENT APPLICATION

This application claims the benefit of Korean Patent Application No. 10-2005-0002875, filed on Jan. 12, 2005, in the Korean Intellectual Property Office, the disclosure of which is incorporated herein in its entirety by reference.

FIELD OF THE INVENTION

The present invention relates to a semiconductor memory device, and more particularly, to a wordline enable signal line arrangement scheme and a method of arranging wordline enable signal lines.

DESCRIPTION OF THE RELATED ART

As the integration density of semiconductor memory devices increases, a hierarchical divided wordline scheme is increasingly used. In the hierarchical divided wordline scheme, a wordline is divided into a plurality of sub-wordlines, each having a predetermined length, and the sub-wordlines are driven using a row decoder and a sub-wordline driver. The sub-wordline driver is controlled using a main wordline signal output from a main wordline driver and a wordline enable signal output from a wordline enable driver.

FIG. 1 is a diagram illustrating the selection and arrangement of wordlines in a conventional semiconductor memory device. Referring to FIG. 1, a plurality of memory cell arrays 101 through 109 are arranged in vertical and horizontal directions. Wordline enable drivers (PXi Driver) 110 and 111 are arranged in a conjunction zone of a memory core region. The wordline enable drivers 110 and 111 use a high voltage, i.e., a VPP voltage, as a power supply voltage and drive their output signals with a VPP voltage.

A sub-wordline driver (SWD) 112 is arranged between a pair of vertically adjacent memory cell arrays, e.g., between the memory cell arrays 105 and 108. The sub-wordline driver 112 drives a sub-wordline (not shown) in response to a signal input thereto via a main wordline NWE and the output signals of the wordline enable driver 110.

In short, the wordline enable drivers 110 and 111 are alternately arranged in the conventional semiconductor memory device, and wordline enable signal lines PXi<1,3> and PXi<0,2> of the wordline enable drivers 110 and 111, respectively, vertically extend and branch off in two opposite horizontal directions forming a T shape. Accordingly, the wordline enable signal lines PXi<1,3> and PXi<0,2> are long and have a large load. Thus, the wordline enable drivers 110 and 111 consume a considerable amount of power, and the speed of driving the sub-wordline is likely to decrease.

SUMMARY OF THE INVENTION

The present invention provides a semiconductor memory device having a wordline enable signal line arrangement scheme which can reduce VPP power consumption and can increase the speed of driving a sub-wordline.

The present invention also provides a method of arranging wordline enable signal lines in the semiconductor memory device which can reduce VPP power consumption and can increase the speed of driving a sub-wordline.

According to an embodiment of the present invention, there is provided a semiconductor memory device. The semiconductor memory device includes: an array region, which comprises a plurality of memory cell arrays arranged in vertical and horizontal directions; a wordline enable driver, which generates a plurality of wordline enable signals in response to a plurality of address signals and outputs the wordline enable signals to wordline enable signal lines; and sub-wordline drivers, which drive a sub-wordline in response to a signal input thereto via a main wordline and a wordline enable signal input thereto via the respective wordline enable signal lines. The wordline enable signal lines vertically and then horizontally extend and are connected to the respective sub-wordline drivers.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

Figure 1:
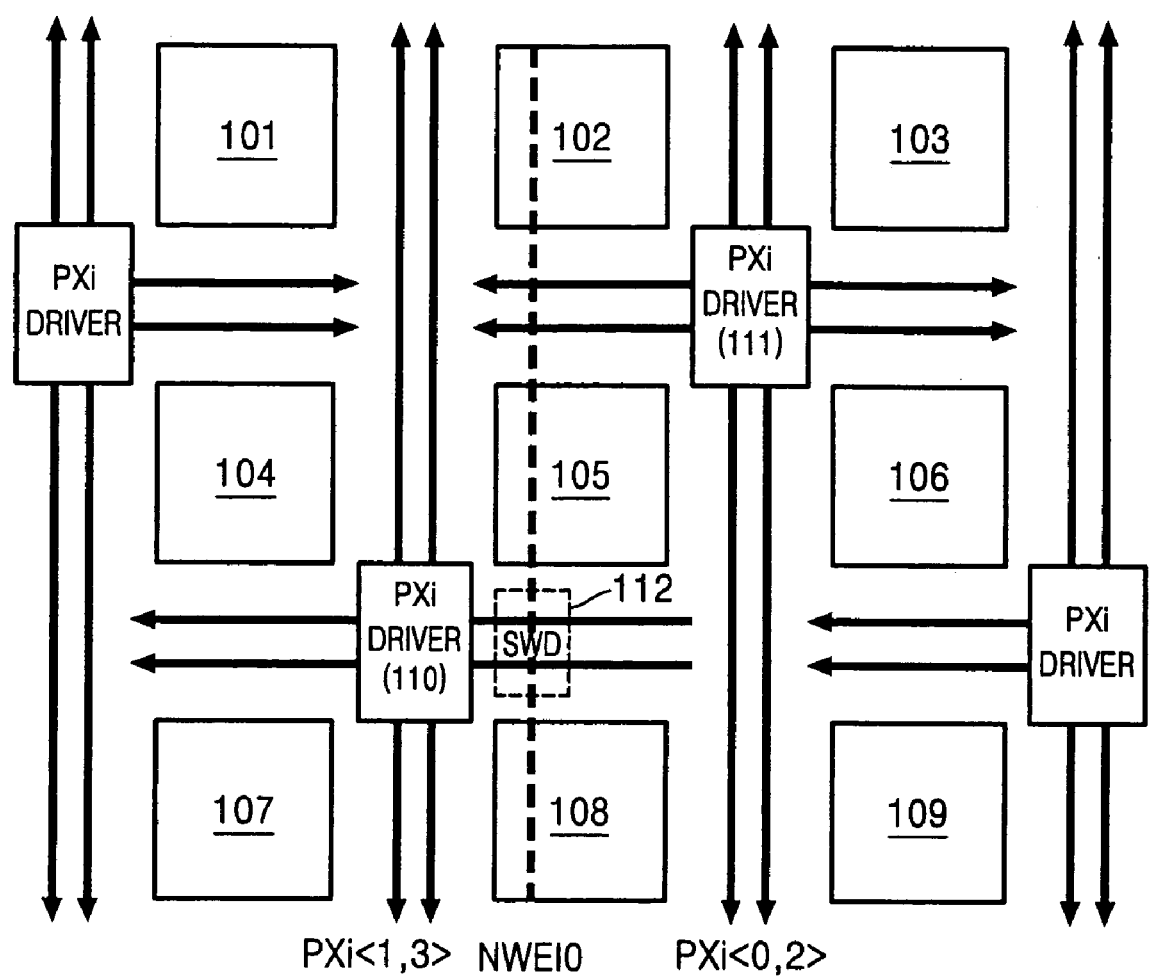
FIG. 1 is a diagram illustrating the selection and arrangement of wordlines in a conventional semiconductor memory device.

The present invention will now be described more fully with reference to the accompanying drawings in which embodiments of the invention are shown. In the drawings, like reference numerals represent like elements.

Figure 2:
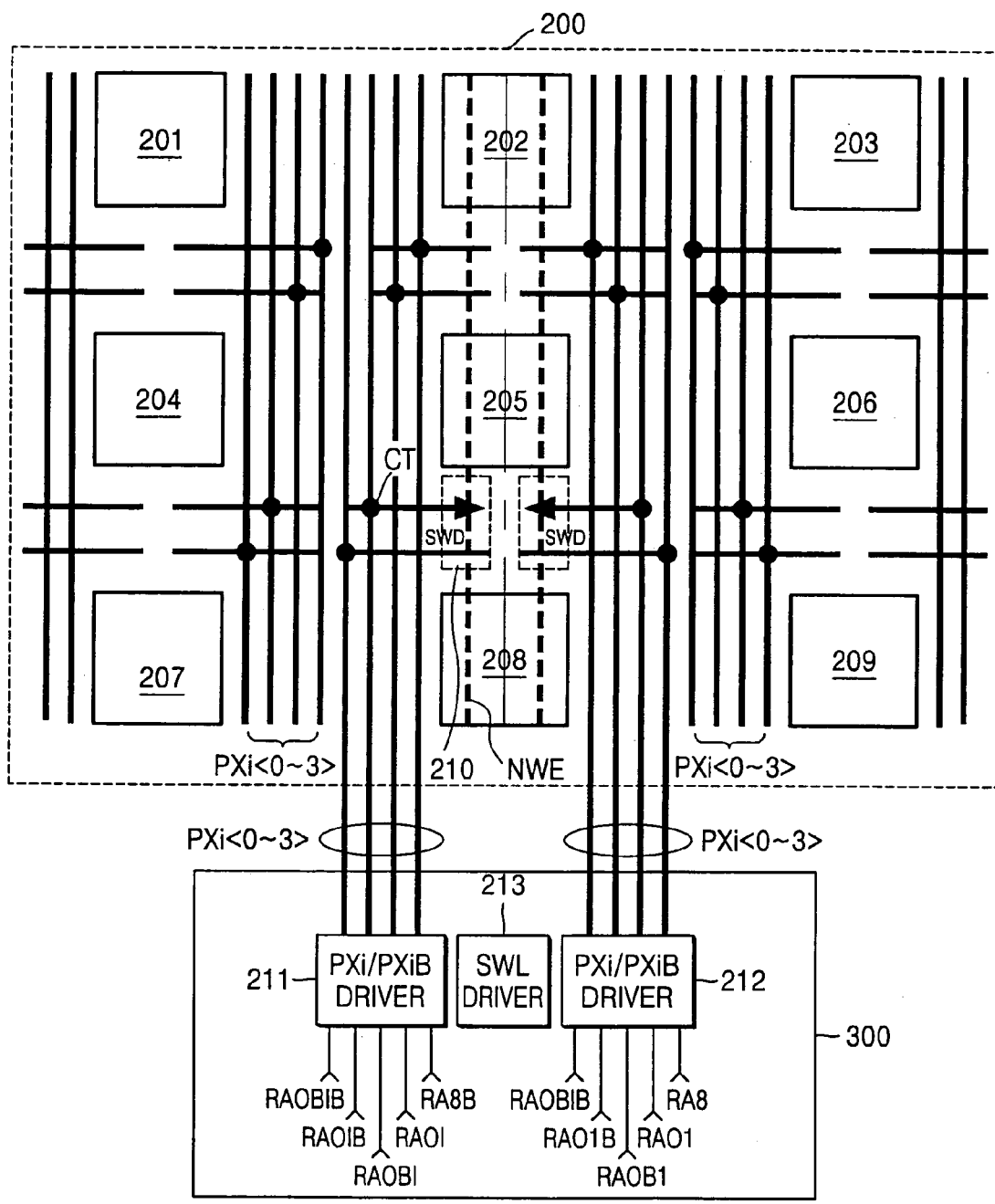
FIG. 2 is a diagram illustrating a wordline enable signal line arrangement scheme of a semiconductor memory device according to an embodiment of the present invention.

FIG. 2 is a diagram illustrating a wordline enable signal line arrangement scheme of a semiconductor memory device according to an embodiment of the present invention. Referring to FIG. 2, the semiconductor memory device adopts a method of arranging wordline enable signal lines according to an embodiment of the present invention. A plurality of memory cell arrays 201 through 209 are vertically and horizontally arranged in an array region 200. Wordline enable drivers (PXi/PXiB DRIVER) 211 and 212 are arranged in a row decoder region 300, which may be located outside of the array region 200.

The wordline enable driver 211 generates a plurality of wordline enable signals in response to a plurality of address signals RA0B1B, RA01B, RA0B1, RA01 and RA8B and outputs the wordline enable signals to the respective wordline enable signal lines PXi<0-3>. The wordline enable driver 212 generates a plurality of wordline enable signals in response to the address signals RA0B1B, RA01B, RA0B1 and RA01 and an address signal RA8 and outputs the wordline enable signals to the respective wordline enable signal lines PXi<0-3>.

The wordline enable drivers 211 and 212 are selected in response to the address signals RA8B and RA8, respectively. The semiconductor memory device is manufactured using three metal layers, and the wordline enable signal lines PXi<0-3> are formed from one of the three metal layers, and in this embodiment illustrated in FIG. 2, from the uppermost metal layer.

Sub-wordline drivers (SWD) 210 are arranged between a pair of vertically adjacent memory cell arrays, for example, between the memory cell arrays 205 and 208. Each of the sub-wordline drivers 210 drives a sub-wordline (not shown) in response to a signal input thereto via a main wordline NWE and a wordline enable signal input thereto via a corresponding wordline enable signal line PXi<0-3>.

As described above, the wordline enable drivers 211 and 212 are arranged in the row decoder region 300, the wordline enable signal lines PXi<0-3> are formed from the uppermost metal layer of the three metal layers constituting the semiconductor memory device, and it is determined whether to select the wordline enable driver 211 or 212 in response to the address signal RA8.

The wordline enable signal lines PXi<0-3> are connected only to the respective sub-wordline drivers 210. Accordingly, each of the wordline enable signal lines PXi<0-3> extends vertically and then horizontally to form an inverse L shape, while each of the wordline enable signal lines PXi<1,3> and PXi<0,2> of FIG. 1 extends vertically and then branches off in two opposite horizontal directions to form a T shape.

Therefore, the wordline enable signal lines PXi<0-3> are shorter than the wordline enable signal lines PXi of FIG. 1 and are formed of a metal having a smaller resistance than the wordline enable signal lines PXi of FIG. 1. Thus, the wordline enable signal lines PXi<0-3> have a smaller load than the wordline enable signal lines PXi of FIG. 1. Consequently, the wordline enable drivers 211 and 212 consume less power than the wordline enable drivers 110 and 111 of FIG. 1, which enables the semiconductor memory device to drive a sub-wordline more quickly than the conventional semiconductor memory device of FIG. 1.

A spare wordline driver (SWL DRIVER) 213 is arranged between the wordline enable drivers 211 and 212.

Figure 3:
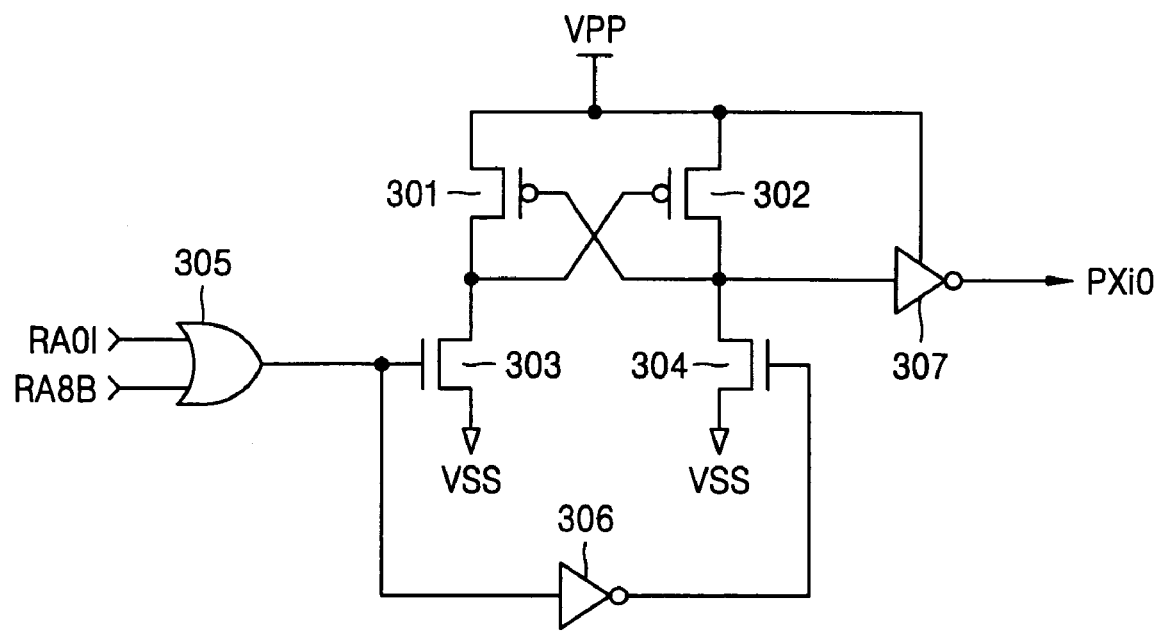
FIG. 3 is a circuit diagram of an example of a wordline enable driver of FIG. 2.

FIG. 3 is a circuit diagram of an example of the wordline enable driver 211 or 212 of FIG. 2. Referring to FIG. 3, the wordline enable driver includes PMOS transistors 301 and 302, NMOS transistors 303 and 304, an AND gate 305, an inverter 306 and a driver 307.

For example, the wordline enable driver is activated in response to address signals RA01 and RA8B, uses a high voltage, e.g., a VPP voltage, as a power supply voltage, and drives an output signal, i.e., a wordline enable signal PXi0, with the VPP voltage.

The wordline enable driver of FIG. 3 illustrates an example of the wordline enable driver 211 or 212 of FIG. 2. However, the wordline enable driver 211 or 212 of FIG. 2 may have a structure other than the structure illustrated in FIG. 3 without departing from the spirit and scope of the present invention.

Figure 4:
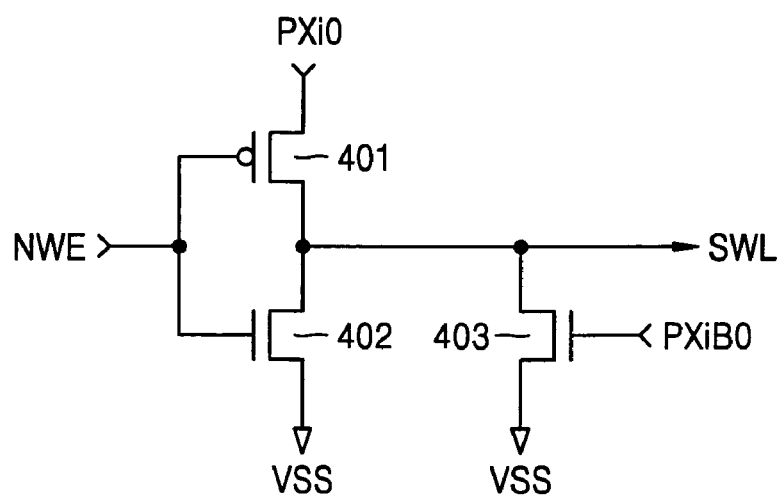
FIG. 4 is a circuit diagram of an example of a sub-wordline driver of FIG. 2.

FIG. 4 is a circuit diagram of an example of the spare wordline driver 213 of FIG. 2. Referring to FIG. 4, the spare wordline driver includes a PMOS transistor 401 and NMOS transistors 402 and 403. The spare wordline driver drives a sub-wordline (not shown) in response to signals input thereto via a main wordline NWE, a wordline enable signal line PXi0, and a complementary wordline enable signal line PXiB0.

The spare wordline driver of FIG. 4 illustrates an example of the spare wordline driver 213 of FIG. 2. However, the spare wordline driver 213 may have a structure other than the structure illustrated in FIG. 4 without departing from the spirit and scope of the present invention.

As described above, wordline enable signal lines of the semiconductor memory device according to the present invention are shorter than wordline enable signal lines of a conventional semiconductor memory device and are formed of metal having a smaller resistance than the conventional semiconductor memory device. Thus, the wordline enable signal lines of the semiconductor memory device according to the present invention have a smaller load than the conventional semiconductor memory device. Accordingly, it is possible to reduce the VPP power consumption of wordline enable drivers and to increase the speed of driving a sub-wordline.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. A semiconductor memory device comprising:
   an array region, which includes a plurality of memory cell arrays arranged in vertical and horizontal directions;
   a wordline enable driver to generate a wordline enable signal on a wordline enable signal line in response to a plurality of address signals;
   a main wordline signal line; and
   a sub-wordline driver connected to the main wordline signal line to drive a sub-wordline in response to a wordline signal applied via the main wordline signal line and the wordline enable signal applied via the wordline enable signal line,
   wherein the wordline enable signal line extends vertically and then horizontally to connect to the sub-wordline driver.

2. The semiconductor memory device of claim 1, wherein the wordline enable driver is arranged in a row decoder region outside the array region.

3. The semiconductor memory device of claim 1, wherein the semiconductor memory device is manufactured using three metal layers, and the wordline enable signal line is formed from the uppermost metal layer among the three metal layers.

4. The semiconductor memory device of claim 1, wherein the sub-wordline driver is arranged between a pair of vertically adjacent memory cell arrays in the array region.

5. A semiconductor memory device comprising:
   a plurality of memory cell arrays arranged in an array region;
   a first wordline enable driver to generate a first wordline enable signal on a first wordline enable signal line in response to a plurality of address signals;
   a second wordline enable driver to generate a second wordline enable signal on a second wordline enable signal line in response to the plurality of address signals;
   a first sub-wordline enable driver arranged between a pair of vertically adjacent memory cell arrays to drive a sub-wordline in response to a first applied wordline signal and the first wordline enable signal applied via the first wordline enable signal line; and
   a second sub-wordline enable driver also arranged between the pair of vertically adjacent memory cell arrays to drive a second sub-wordline in response to a second applied wordline signal and the second wordline enable signal applied via the second wordline enable signal line,
   wherein the first and second wordline enable signal lines extend vertically and then horizontally from the first and second wordline enable drivers to the respective first and second sub-wordline enable drivers.

6. The semiconductor memory device of claim 5, wherein the first and second wordline enable drivers are arranged in a row decoder region outside the array region.

7. The semiconductor memory device of claim 5, wherein the semiconductor memory device is manufactured using three metal layers, and the first and second wordline enable signal lines are formed from the uppermost metal layer among the three metal layers.

8. A method of arranging wordline enable signal lines in a semiconductor device comprising: an array region, which comprises a plurality of memory cell arrays arranged in vertical and horizontal directions; a wordline enable driver, which generates a plurality of wordline enable signals in response to a plurality of address signals and outputs the wordline enable signals to wordline enable signal lines; and a sub-wordline driver, which drives a sub-wordline in response to signals input thereto via a main wordline and a wordline enable signal input thereto via the respective wordline enable signal lines, the method comprising:

arranging the wordline enable driver in a row decoder region outside the array region;

arranging the sub-wordline driver between a pair of vertically adjacent memory cell arrays in the array region; and connecting the wordline enable signal lines between the sub-wordline driver and an output port of the wordline enable driver.

9. The method of claim 5, wherein the semiconductor memory device is manufactured using three metal layers, and the wordline enable signal lines are formed from the uppermost metal layer among the three metal layers.

10. A method of arranging wordline signals in a semiconductor device, comprising:

generating a wordline enable signal in response to a plurality of address signals on a wordline enable signal line, wherein the wordline enable signal line is formed to extend vertically and then horizontally from a wordline enable driver to a sub-wordline driver; and driving a sub-wordline to a plurality of memory cell arrays with the sub-wordline driver in response to both a wordline signal applied via a main wordline and the wordline enable signal.

11. The method of claim 10, wherein the sub-wordline driver is arranged between a pair of vertically adjacent memory cell arrays.

12. The method of claim 10, wherein the semiconductor memory device is manufactured using three metal layers, and the wordline enable signal line is formed from the uppermost metal layer among the three metal layers.

13. The method of claim 10, wherein the plurality of memory cell arrays are arranged in an array region and the wordline enable driver is located in a row decoder region outside of the array region.

14. The semiconductor memory device of claim 1, wherein the wordline enable signal line is only connected to the wordline enable driver and the sub-wordline driver.

15. The semiconductor memory device of claim 5, wherein the first wordline enable signal line is only connected to the first wordline enable driver and the first sub-wordline driver, and the second first wordline enable signal line is only connected to the second wordline enable driver and the second sub-wordline driver.

* * * * *